United States Patent
Maruyama et al.

(10) Patent No.: US 9,985,581 B2
(45) Date of Patent: May 29, 2018

(54) SOLAR CELL MODULE

(71) Applicant: Panasonic Intellectual Property Management Co., Ltd., Osaka-shi, Osaka (JP)

(72) Inventors: Yu Maruyama, Shiga (JP); Shuji Fukumochi, Shiga (JP); Shinichiro Tsujii, Hyogo (JP); Kazuki Yamada, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 84 days.

(21) Appl. No.: 14/748,713

(22) Filed: Jun. 24, 2015

(65) Prior Publication Data

US 2015/0295534 A1    Oct. 15, 2015

Related U.S. Application Data

(63) Continuation of application No. PCT/JP2013/006912, filed on Nov. 25, 2013.

(30) Foreign Application Priority Data

Jan. 29, 2013  (JP) ................. 2013-014268

(51) Int. Cl.
| | |
|---|---|
| *H02S 30/10* | (2014.01) |
| *H01L 31/05* | (2014.01) |
| *H02S 40/34* | (2014.01) |
| *F24J 2/52* | (2006.01) |

(52) U.S. Cl.
CPC .......... *H02S 40/34* (2014.12); *H01L 31/0504* (2013.01); *H02S 30/10* (2014.12); *F24J 2/5211* (2013.01); *F24J 2002/5273* (2013.01)

(58) Field of Classification Search
None
See application file for complete search history.

(56) References Cited

U.S. PATENT DOCUMENTS

| 5,280,133 A | * | 1/1994 | Nath ................ H01L 31/048 |
| | | | 136/251 |
| 5,951,785 A | * | 9/1999 | Uchihashi ............ F24J 2/5262 |
| | | | 136/246 |

(Continued)

FOREIGN PATENT DOCUMENTS

| JP | 11330524 A | 11/1999 |
| JP | 2001182264 A | 7/2001 |

(Continued)

OTHER PUBLICATIONS

Machine translation of JP2001-182264A.*

(Continued)

*Primary Examiner* — Eric R Smith
(74) *Attorney, Agent, or Firm* — Cantor Colburn LLP

(57) ABSTRACT

A solar cell module comprises: a solar cell panel; a terminal box mounted to the back surface of the solar cell panel, which is one surface thereof; a frame mounted to the edges of the solar cell panel; and a metallic first cover composed of a base section for covering the back surface of the terminal box, which is one surface thereof, and of an affixation section affixed to a frame which composes the frame.

5 Claims, 7 Drawing Sheets

(56) References Cited

U.S. PATENT DOCUMENTS

| | | | | |
|---|---|---|---|---|
| 6,307,144 B1* | 10/2001 | Mimura | ............... | H01L 31/05 136/244 |
| 2003/0070368 A1* | 4/2003 | Shingleton | ............. | F24J 2/5205 52/173.3 |
| 2005/0144903 A1* | 7/2005 | Ceria | ............. | E04B 7/12 52/782.1 |
| 2006/0219291 A1 | 10/2006 | Hikosaka et al. | | |
| 2007/0056625 A1 | 3/2007 | Higuchi et al. | | |
| 2008/0053517 A1* | 3/2008 | Plaisted | ............. | F24J 2/5207 136/251 |
| 2009/0064606 A1* | 3/2009 | Ceria | ............. | E04D 3/352 52/173.3 |
| 2010/0147362 A1* | 6/2010 | King | ............. | F24J 2/4614 136/251 |
| 2011/0146793 A1* | 6/2011 | Comert | ............. | B60J 1/007 136/259 |
| 2011/0155456 A1* | 6/2011 | Li | ............. | H02S 40/34 174/565 |
| 2012/0006386 A1* | 1/2012 | Klinga | ............. | H01L 31/05 136/251 |
| 2013/0039028 A1* | 2/2013 | Korman | ............. | H01L 31/02013 361/829 |
| 2013/0140416 A1* | 6/2013 | West | ............. | H01L 31/0422 248/222.11 |
| 2015/0101653 A1* | 4/2015 | Cioffi | ............. | H02S 20/00 136/251 |

FOREIGN PATENT DOCUMENTS

| | | | |
|---|---|---|---|
| JP | 2001339087 A | | 12/2001 |
| JP | 2006286838 A | | 10/2006 |
| JP | 2007081034 A | | 3/2007 |
| JP | 2007095819 A | | 4/2007 |
| JP | 2010177631 A | * | 8/2010 |
| JP | 2010192854 A | | 9/2010 |

OTHER PUBLICATIONS

Machine translation of JP2010-192854A.*
Machine translation of JP2010-177631A.*
International Search Report corresponding to Application No. PCT/JP2013/006912; dated Feb. 25, 2014, with English translation.

* cited by examiner

SOLAR CELL MODULE

CROSS REFERENCE TO RELATED APPLICATIONS

This application is a continuation under 35 U.S.C. § 120 of PCT/JP2013/006912, filed Nov. 25, 2013, which is incorporated herein reference and which claimed priority under 35 U.S.C. § 119 to Japanese Application No. 2013-014268, filed Jan. 29, 2013, the entire content of which is also incorporated herein by reference.

TECHNICAL FIELD

The present invention relates to a solar cell module.

BACKGROUND ART

Patent Documents 1 and 2 describe solar cell modules in which a terminal box is provided on a back surface side of a solar cell panel. More specifically, Patent Document 1 discloses a structure in which a terminal box is attached to a back surface side substrate of a solar cell panel using an adhesive. Patent Document 2 discloses a structure in which an opening space is provided on apart of a frame, and a terminal box is fitted into the space.

RELATED ART REFERENCES

Patent Documents

[Patent Document 1] JP 2007-81034 A
[Patent Document 2] JP 2007-95819 A

DISCLOSURE OF INVENTION

Technical Problem

For a solar cell module, various safety measures are demanded, and one of the safety measures is prevention of dropping-off of the terminal box. For a terminal box, it is required that the terminal box does not drop off even during an emergency, such as in the case of fire. The structure disclosed in Patent Document 2 is considered as having a superior fixing characteristic for the terminal box, but has a disadvantage that the structure of the frame becomes complex.

Solution to Problem

According to one aspect of the present invention, there is provided a solar cell module comprising: a solar cell panel; a terminal box that is attached to a surface on one side of the solar cell panel; a frame that is attached to an end edge of the solar cell panel; and a metal cover having a base that covers a surface on one side of the terminal box and a fixation unit that is fixed to the frame.

Advantageous Effects of Invention

According to solar cell modules according to various aspects of the present invention, dropping-off of the terminal box can be prevented even during an emergency such as in the case of fire, with a simple method.

EMBODIMENT

A preferred embodiment of the present invention will now be described in detail with reference to the drawings.

The drawings referred to in the embodiment are schematically drawn, and a size ratio or the like of the constituting elements drawn in the figures may differ from actual devices. Specific size ratios or the like should be determined in consideration of the following description.

In the description herein, description of "approximately **" is intended, for example, in the case of "approximately the same", to include not only the structures that are completely the same, but also the structures that are substantially the same.

Figure 1:
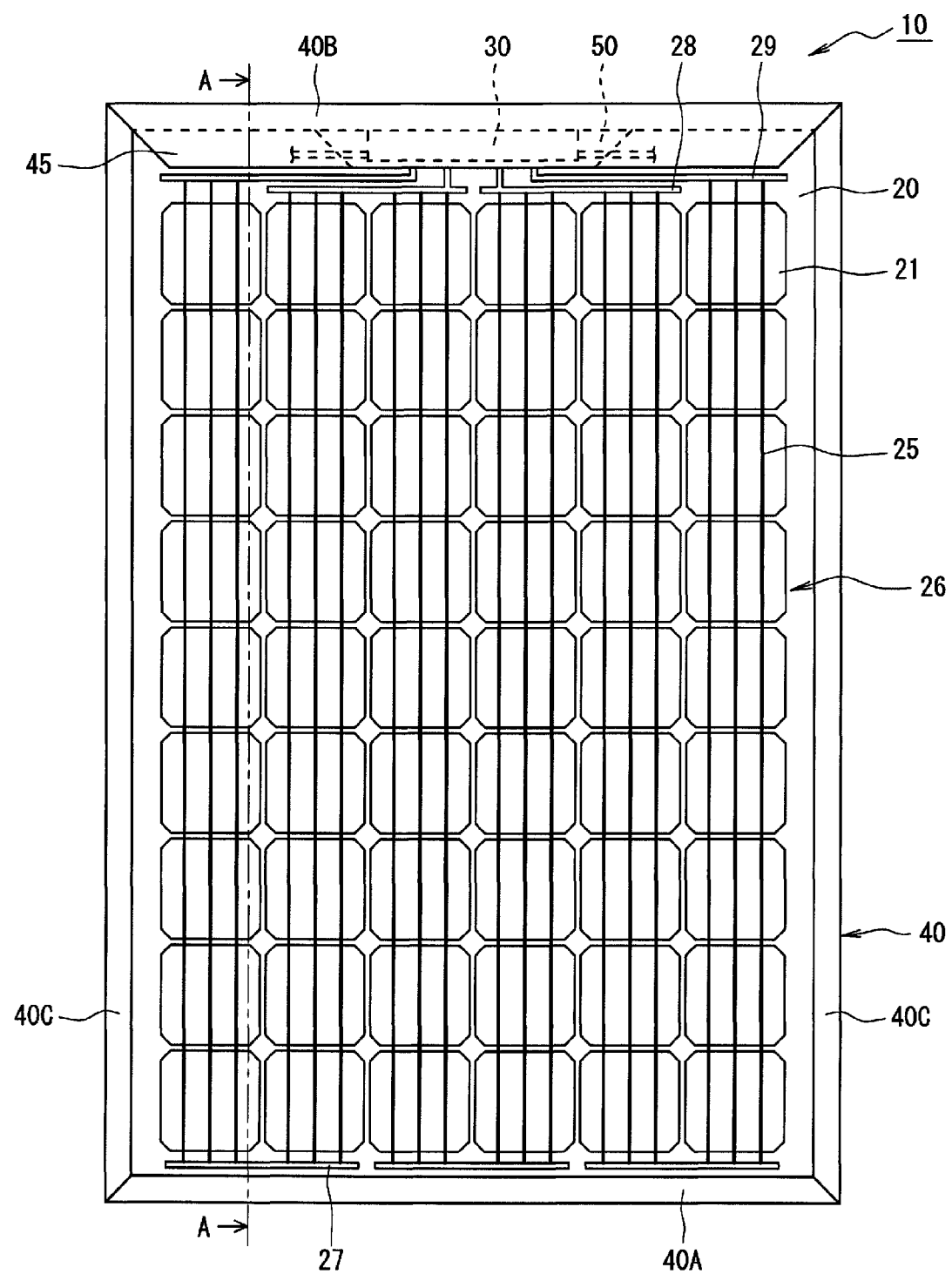
FIG. 1 is a diagram showing a solar cell module according to a preferred embodiment of the present invention, viewed from a light receiving surface side.
Figure 2:
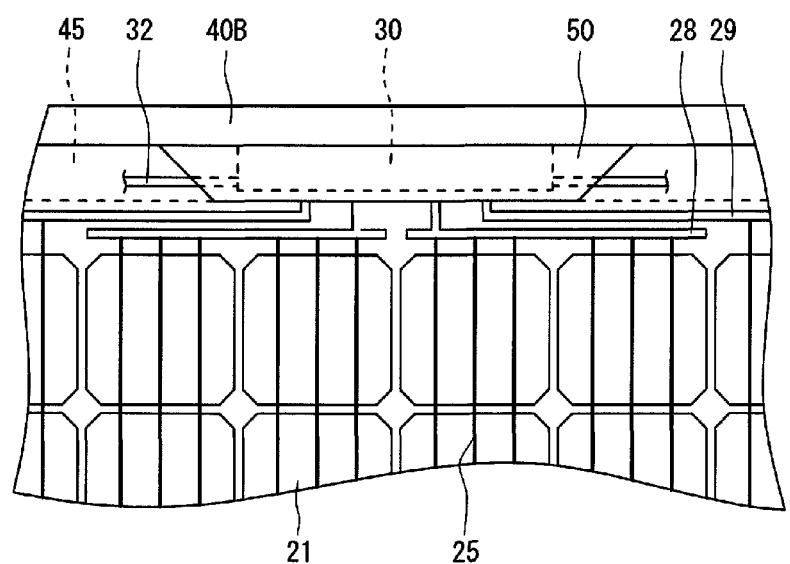
FIG. 2 is a diagram of a part of a solar cell module according to a preferred embodiment of the present invention, viewed from a back surface side.
Figure 3:
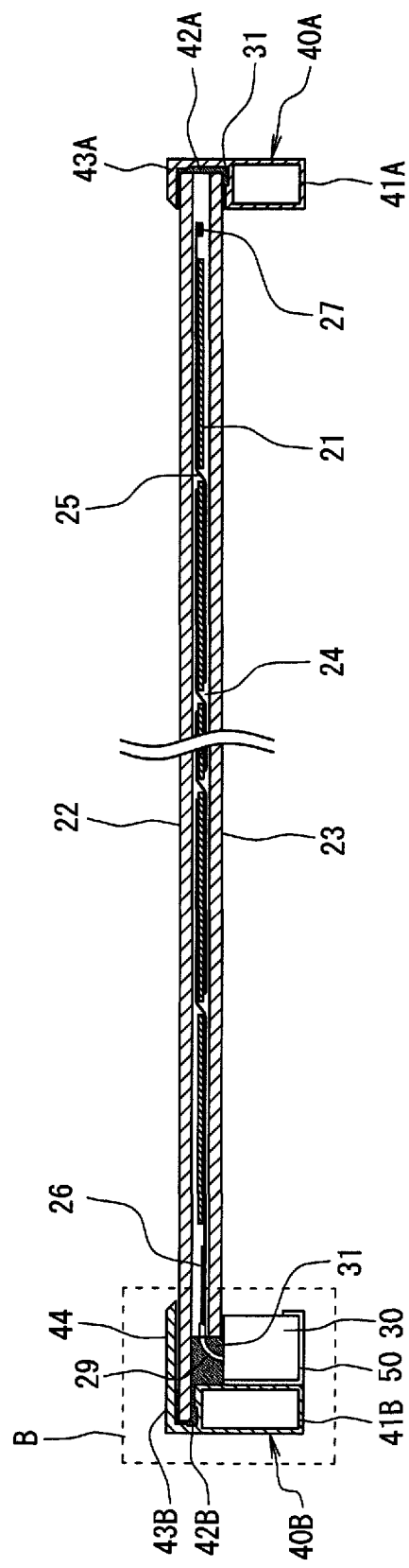
FIG. 3 is a cross sectional diagram along an AA line in FIG. 1.

FIG. 1 is a diagram showing a solar cell module 10 according to a preferred embodiment of the present invention viewed from a light receiving surface side, and FIG. 2 is a diagram showing the solar cell module 10 from a back surface side. FIG. 3 is a cross sectional diagram along an AA line in FIG. 1. In the present embodiment, a "light receiving surface" of the solar cell module 10 refers to a surface through which the solar light is primarily incident, and a "back surface" refers to a surface on a side opposite to the light receiving surface. The terms "light receiving surface" and "back surface" are also similarly used for a solar cell panel 20 and a terminal box 30.

As shown in FIGS. 1-3, the solar cell module 10 comprises the solar cell panel 20, a terminal box 30 attached to a back surface of the solar cell panel 20, and a frame 40 attached to an end edge of the solar cell panel 20. Further, the solar cell module 10 comprises a first terminal box cover 50 (hereinafter referred to as a "first cover 50") which is a metal cover fixed on the frame 40 and which covers the back surface of the terminal box 30. The solar cell panel 20 exemplified in FIG. 1 has a rectangular shape in the planar view. Frames 40A and 40B are attached on the end edges of the short side and a frame 40C is attached to an end edge on the long side. The "planar view" refers to a planar shape viewed from a vertical direction with respect to the light receiving surface.

The solar cell panel 20 comprises a plurality of solar cell elements 21, a first protection member 22 placed on the light receiving surface side of the solar cell element 21, and a second protection member 23 placed on the back surface side of the solar cell element 21. The plurality of solar cell elements 21 are sandwiched by the first protection member 22 and the second protection member 23, and are sealed by a encapsulant 24.

The solar cell panel 20 comprises a wiring member 25 attached to an electrode of the solar cell element 21. The wiring member 25 connects adjacent solar cell elements 21 in series, to form a string 26 of the solar cell elements 21. In the present embodiment, six columns of strings 26 are formed extending in a longitudinal direction of the solar cell panel 20. The wiring members 25 extending from ends of adjacent strings 26 are connected by a first bridge wiring member 27 and a second bridge wiring member 28. The second bridge wiring member 28 extends from the solar cell panel 20 and is connected to a bypass diode (not shown) provided in the terminal box 30. An output wiring member 29 is connected to each of the wiring members 25 extending from the ends of the columns of the strings 26. The output wiring members 29 extend from the solar cell panel 20 as a cathode terminal and an anode terminal, and are connected to the terminal box 30.

The solar cell element 21 comprises a photoelectric conversion unit which generates carriers by receiving solar light. In the photoelectric conversion unit, for example, a light receiving surface electrode is formed over the light receiving surface and a back surface electrode is formed over the back surface (both electrodes are not shown in the figures). The structure of the solar cell element 21 is not particularly limited, and may be, for example, a structure in which the electrodes are formed only over the back surface of the photoelectric conversion unit.

The photoelectric conversion unit comprises a semiconductor substrate such as, for example, crystalline silicon (c-Si), gallium arsenide (GaAs), indium phosphide (InP), or the like, an amorphous semiconductor layer formed over the substrate, and a transparent conductive layer formed over the amorphous semiconductor layer. As a specific example structure, a structure may be exemplified in which, over a light receiving surface of an n-type monocrystalline silicon substrate, an i-type amorphous silicon layer, a p-type amorphous silicon layer, and a transparent conductive layer are sequentially formed, and, over a back surface, an i-type amorphous silicon layer, an n-type amorphous silicon layer, and a transparent conductive layer are sequentially formed. The transparent conductive layer is preferably formed by a transparent conductive oxide in which a metal oxide such as indium oxide ($In_2O_3$) and zinc oxide (ZnO) is doped with tin (Sn), antimony (Sb), or the like.

The electrode comprises, for example, a plurality of finger portions and a plurality of bus bar portions. The finger portion is a narrow line-shaped electrode formed over a wide area over the transparent conductive layer, and the bus bar portion is an electrode that collects carriers from the finger portion. The wiring member 25 is attached to the bus bar portion.

For the first protection member 22, for example, a light-transmissive member such as a glass substrate, a resin substrate, a resin film, or the like may be used. Of these materials, from the viewpoint of fire resistance and endurance, a glass substrate is preferable. For the second protection member 23, members similar to those for the first protection member 22 may be used, or, in the case that incidence of light from the back surface side does not need to be considered, a member which is not light-transmissive may be used. In the present embodiment, glass substrates having light transmissive characteristic are used for both the first protection member 22 and the second protection member 23. For the encapsulant 24, for example, a resin such as an ethylene vinyl acetate (EVA) copolymer, polyvinyl butyral (PVB), or the like may be used.

The terminal box 30 is attached at an end edge along the short side of the solar cell panel 20 (hereinafter referred to as an "end edge B") on the back surface of the solar cell panel 20. The terminal box 30 is attached on the back surface of the solar cell panel 20, for example, by an adhesive 31. As the adhesive 31, a silicone resin-based adhesive is preferable, and an adhesive similar to an adhesive for fixing the solar cell panel 20 to the frame 40 to be described later may be used. The shape or the like of the terminal box 30 is not particularly limited, but the terminal box 30 is preferably a resin case having an approximate rectangular parallelepiped shape.

In the terminal box 30, preferably, a plurality of terminal bases are built in. The wiring members extending into the terminal box 30 are attached to the terminal bases by a method such as soldering. To a terminal base to which the output wiring member 29 is connected, a power cable 32 for outputting electric power from the module is attached. The power cable 32 extends from both ends of the terminal box 30 in the longitudinal direction.

The terminal box 30 is attached along a longitudinal direction of the frame 40B. More specifically, the terminal box 30 is preferably attached such that the longitudinal direction of the terminal box 30 is approximately parallel to the longitudinal direction of the frame 40B and the terminal box 30 is in contact with the frame 40B.

As described above, the frame 40 is formed by combining three frames 40A, 40B, and 40C, and surrounds the four sides of the solar cell panel 20. The solar cell panel 20 is fitted to a concave portion to be described later and is fixed on the frame 40 using the adhesive 31. The frame 40 is a metal frame made of stainless steel, aluminum, or the like, and is preferably an aluminum frame from the viewpoint of weight reduction or the like. The frame 40 protects the end edge of the solar cell panel 20, and is used as a fixation member when the solar cell module 10 is mounted on a roof or the like. The frame 40 is also used for discharging heat of the diode built in the terminal box 30 when the terminal box 30 is placed in contact with the frame 40.

The frame 40A is a frame attached to an end edge along a short side, which is on a side opposite of the end edge B of the solar cell panel 20, and comprises a body 41A having a hollow structure and a concave portion 42A to which the end edge of the solar cell panel 20 is fitted. The body 41A has an approximate rectangular shape in which a cross section cut in a direction orthogonal to the longitudinal direction (width direction) is slightly elongated in the up-and-down direction. Hereinafter, the "cross section" of the frame 40 refers to a cross section cut in the width direction unless otherwise specified. The "up-and-down direction" of the frame 40 or the like refers to a thickness direction of the solar cell panel 20, with the light receiving surface side referred to as an "upper side" and the back surface side referred to as a "lower side".

The frames are connected to each other using, for example, corner pieces (not shown) squeezed from ends in the longitudinal direction into the cavity of the body. The frames are cut in an approximate trapezoidal shape in the planar view in which the length in the longitudinal direction becomes smaller from the outer side toward the inner side such that the end surfaces contact each other at the connection portion. The frame 40B also preferably has an approximate trapezoidal shape in the planar view as a whole, including a second terminal box cover 44 to be described later. The "inner side" of each frame refers to the side of the solar cell panel 20, and the "outer side" refers to the opposite side of the inner side.

The concave portion 42A is formed in a shape of an approximate U-shaped cross section by an upper surface of the body 41A and a hold-down member 43A which is a member provided on the body 41A and having an approximate L-shaped cross section extending in the longitudinal direction. In other words, the concave portion 42A is a groove into which the end edge of the solar cell panel 20 can be inserted from the inner side. The hold-down member 43A has a first portion extending upwards from an outer side of the upper surface of the body 41, and a second portion extending from an upper end of the first portion toward the inner side. A length in the width direction of the second portion is approximately equal to the length in the width direction of the body 41A.

In the present embodiment, the end of the first protection member 22 and the end of the second protection member 23 coincide at end edges other than the end edge B of the solar cell panel 20. In other words, the concave portions of the frames 40A and 40C are grooves into which the first protection member 22, the second protection member 23, and the encapsulant 24 sandwiched between the protection members, or the like, can be fitted. On the other hand, at the end edge B, the first protection member 22 extends beyond the end of the second protection member 23. The concave portion 42B of the frame 40B is a groove into which only the first protection member 22 can be fitted, and is narrower than the concave portions of the frames 40A and 40C. The frame 40C has the same structure as that of the frame 40A except that the length in the longitudinal direction (hereinafter simply referred to as "length") is longer than that of the frame 40A.

The frame 40B is attached to the end edge B of the solar cell panel 20. Similar to the frames 40A and 40C, the frame 40B has a body 41B and a concave portion 42B. The concave portion 42B is formed by an upper surface of the body 41B and a hold-down member 43B which is provided over the body 41B and which is a member having an approximate L-shaped cross section extending in the longitudinal direction. However, a length of the first portion of the hold-down member 43B is shorter than those of the frames 40A and 40C.

The frame 40B preferably has a second terminal box cover 44 (hereinafter simply referred to as "second cover 44") which covers a light receiving surface side of a portion, of the solar cell panel 20, in which the terminal box 30 is attached. The second cover 44 is preferably provided in a manner such that the terminal box 30 cannot be seen at least when the solar cell module 10 is viewed in the planar view from directly above, and is preferably provided to not cover the solar cell element 21. By providing the second cover 44 and covering the light receiving surface side of the terminal box 30, when sparks of fire fall over the module due to fire or the like, transfer of heat to the terminal box 30 becomes more difficult. With such a configuration, melting or the like of the adhesive 31 that fixes the terminal box 30 can be inhibited and fire resistivity of the module can be improved.

In addition, the second cover 44 hides the terminal box 30, so that the design of the module can be improved.

In the second cover 44, the hold-down member 43B forming the concave portion 42B is preferably provided to extend more into the inner side than the body 41B. From the viewpoint of improvement of the fire resistivity or the like, preferably, the adhesive 31 is not provided between the second cover 44 and the solar cell panel 20, and the second cover 44 is not adhered to the light receiving surface. Alternatively, the second cover 44 may be formed only in a region near the center in the longitudinal direction of the frame 40b to which the terminal box 30 is attached, or may be formed over the entire length in the longitudinal direction of the frame 40B, as shown in FIG. 1.

A structure of the first cover 50 will now be described in detail with further reference to FIGS. 4-6.

Figure 4:
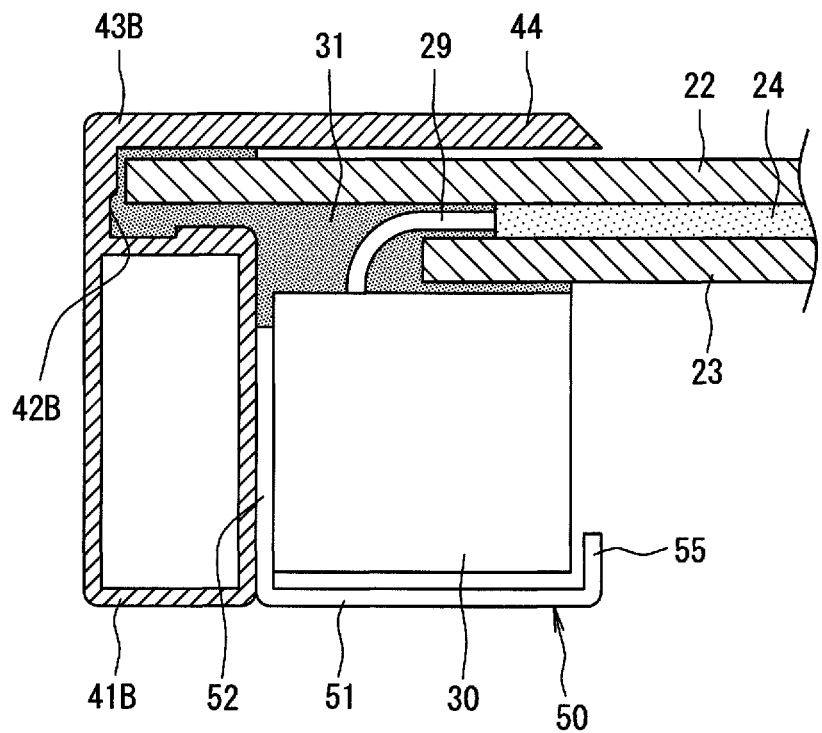
FIG. 4 is an exploded view of a B part of FIG. 3.

FIG. 4 is an enlarged view of a B part of FIG. 3. FIG. 5 is a perspective view showing the terminal box 30 and the first cover 50 in an exploded manner, and FIG. 6 is a perspective view focusing on and showing the first cover 50.

Figure 5:
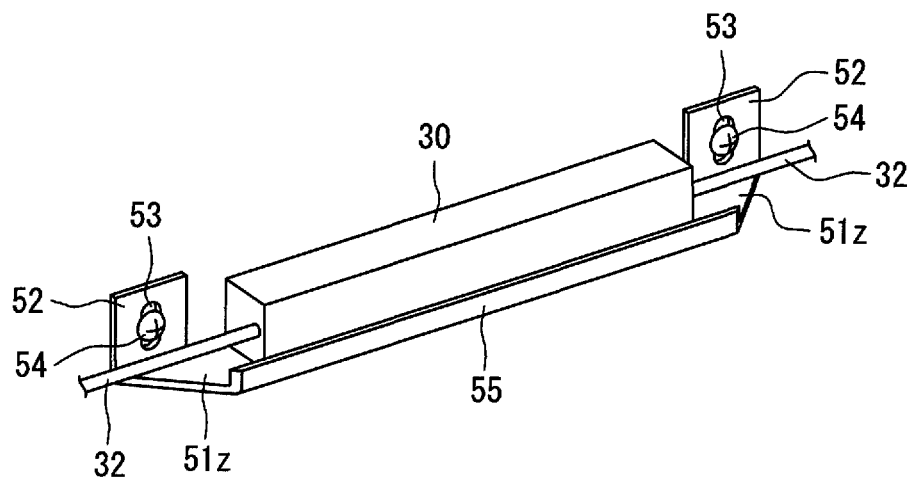
FIG. 5 is a perspective diagram showing in an enlarged manner a terminal box and a first terminal box cover according to a preferred embodiment of the present invention.
Figure 6:
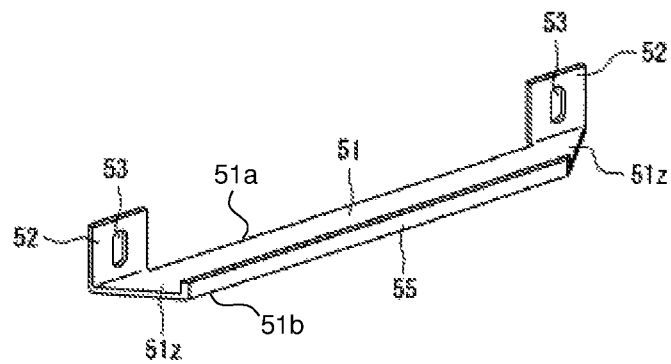
FIG. 6 is a perspective diagram separately showing a first terminal box cover of a device according to a preferred embodiment of the present invention.

As shown in FIGS. 4-6, the first cover 50 has a base 51 which covers a back surface of the terminal box 30, and a fixation unit 52 fixed to the frame 40B. The first cover 50 has a function to catch the terminal box 30 when, for example, the terminal box 30 is detached from the back surface of the solar cell panel 20 due to fire or the like. In addition, the first cover 50 also has a function to protect the terminal box 30 from hail or the like that hits and bounces off from the roof or the like. The first cover 50 is a metal cover, and is preferably an aluminum cover similar to the frame 40.

The first cover 50 is attached along the longitudinal direction of the frame 40B similar to the terminal box 30. More specifically, the first cover 50 is provided such that the longitudinal direction of the first cover 50 is approximately parallel with the longitudinal direction of the terminal box 30 and the frame 40B. Preferably, the first cover 50 is also provided such that the first cover 50 does not extend lower than the body 41B of the frame 40B.

The base 51 is a portion which covers the back surface of the terminal box 30, and preferably has a flat plate shape. The base 51 may be provided in contact with the back surface of the terminal box 30, but is preferably provided with a gap between the terminal box 30 and the base 51 (for example, a gap of about 1 mm~5 mm) in order to reduce transfer of shock to the terminal box 30 when hail or the like hits the base 51.

The base 51 is provided, for example, approximately parallel to the back surface of the terminal box 30. The length in the longitudinal direction of the base 51 is preferably longer than the length in the longitudinal direction of the terminal box 30. On both sides in the longitudinal direction of the base 51, an extension region 51z extending from a position covering the back surface of the terminal box 30 is formed, respectively. In other words, the first cover 50 is attached to the frame 40B in a manner such that the extension regions 51z are formed on both sides in the longitudinal direction of the base 51.

The fixation unit 52 is preferably provided approximately perpendicular to the base 51 on one end in the width direction of the base 51. The fixation unit 52 can be attached to the body 41B of the frame 40B. A screw hole 53 is preferably formed in the fixation unit 52, and the fixation unit 52 is screwed onto the body 41B, for example, using a screw 54. The fixation method of the fixation unit 52 is not limited to screwing, and the fixation may alternatively be achieved by welding or the like.

The fixation unit 52 is preferably provided at each of two locations in each extension region 51z. Specifically, between the fixation units 52, there is no wall separating the terminal box 30 and the frame 40B, and the terminal box 30 can be fixed not only on the back surface of the solar cell panel 20, but also with respect to the frame 40B by the adhesive 31 or the like. In the longitudinal direction of the first cover 50, the length of the fixation unit 52 is, for example, similar to the length of the extension region 51z. At each of the fixation units 52 at two locations, the screw hole 53 is respectively formed, and the first cover 50 is screwed to the frame 40B at a position nearer to both ends in the longitudinal direction of the frame 40B than both ends in the longitudinal direction of the terminal box 30.

The extension region 51z is cut such that the length in the longitudinal direction on the other end side in the width direction of the base 51 is shorter than that on one end side in the width direction of the base 51 on which the fixation unit 52 is provided. In the present embodiment, the extension region 51z is cut in a straight line shape in a direction intersecting the width direction and the longitudinal direction of the base 51, and the base 51 has an approximate trapezoidal shape in the planar view similar to the second cover 44. As described above, the first cover 50 is screwed at a position nearer to both ends in the longitudinal direction of the frame 40B than both ends in the longitudinal direction of the terminal box 30, and the extension region 51z is cut to have an approximate trapezoidal shape in the planar view, so that the first cover 50 can be easily attached.

The first cover 50 preferably further has a side wall section 55 which covers a side surface of the terminal box 30. The side wall section 55 is provided on the other end in the width direction of the base 51 which is at an opposite side from the one end in the width direction of the base 51 where the fixation unit 52 is provided. Here, the "side surface" of the terminal box 30 refers to a surface along the up-and-down direction, and the side surface of the terminal box 30 covered by the side wall section 55 in the present embodiment is a side surface along a longitudinal direction of the terminal box 30. By providing the side wall section 55, the dropping-off of the terminal box 30 can be prevented to a higher degree.

The side wall section 55 is preferably provided approximately perpendicular to the base 51 in consideration of the attachment characteristic of the first cover 50 or the like. The side wall section 55 is, for example, shorter in a length in the up-and-down direction than the length in the up-and-down direction of the fixation unit 52 (for example, about ⅕~⅓ of the fixation unit 52), and is provided over the entire length of the other end in the width direction of the base 51. Preferably, a gap is also provided between the side wall section 55 and the terminal box 30.

According to the solar cell module 10 having the above-described structure, because the first cover 50 is provided, dropping-off of the terminal box 30 can be prevented even during an emergency such as in the case of fire. In the solar cell module 10, fire resistivity is increased by providing the second cover 44. However, the terminal box 30 may still be detached from the back surface of the solar cell panel 20 due to melting of the adhesive 31 by heat of a fire or the like, and, in such a case, the terminal box 30 may be caught by the first cover 50.

In addition, by providing the first cover 50, it becomes possible to prevent hail hitting and bouncing off from the roof or the like from hitting the terminal box 30 from the back surface side of the solar cell module 10, and to consequently prevent damage to the terminal box 30.

Figure 7A:
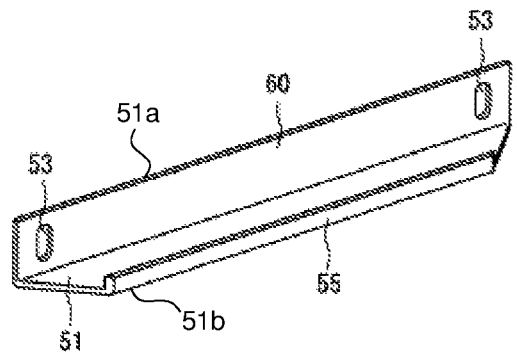
FIG. 7A is a diagram showing a terminal box cover according to another preferred embodiment of the present invention.

The above-described embodiment can be arbitrarily changed in design within a scope that does not lose the advantage of the present invention. For example, in the above-described embodiment, the fixation unit 52 is provided at each of two locations in each extension region 51z, but alternatively, as shown in FIG. 7A, one fixation unit 60 may be provided over the entire length in the longitudinal direction of the base 51, approximately perpendicular to the base 51. The screw hole 53 is preferably formed at 2 locations near both ends in the longitudinal direction of the fixation unit 60. In this case, the fixation unit 60 is inserted between the terminal box 30 and the frame 40B, and the terminal box 30 is sandwiched from both sides in the width direction by the fixation unit 60 and the side wall section 55.

Figure 7B:
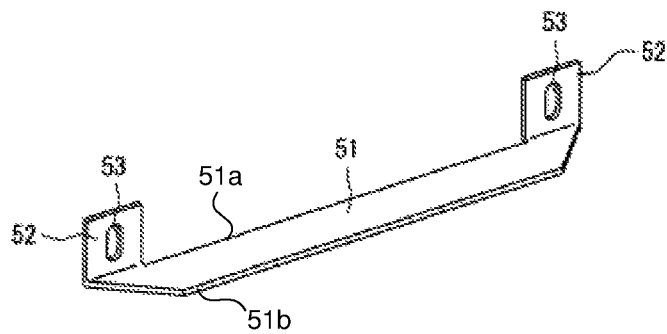
FIG. 7B is a diagram showing a terminal box cover according to another preferred embodiment of the present invention.

Moreover, in the above-described embodiment, the side wall section 55 is provided, but alternatively, a configuration may be employed in which the side wall section 55 is not provided, as shown in FIG. 7B. For example, in the case of a module which is placed with the frame 40B directed vertically downward, preferably, the side wall section 55 is omitted, to simplify the structure of the cover.

Figure 7C:
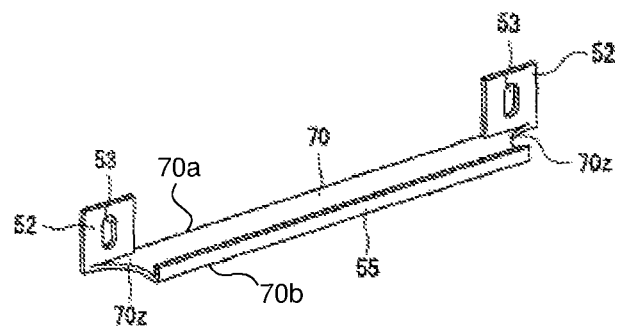
FIG. 7C is a diagram showing a terminal box cover according to another preferred embodiment of the present invention.
Figure 7D:
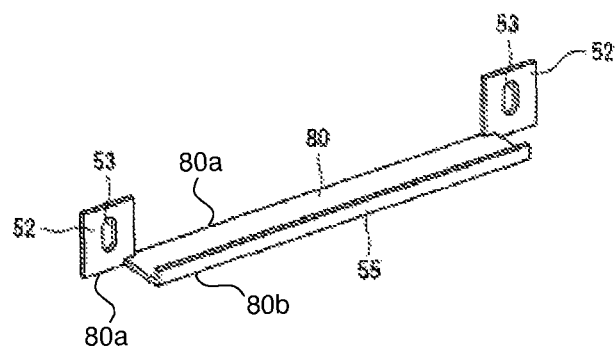
FIG. 7D is a diagram showing a terminal box cover according to another preferred embodiment of the present invention.

Furthermore, in the above-described embodiment, the base 51 has an approximate trapezoidal shape in the planar view, but alternatively, the base may have other shapes, as shown in FIGS. 7C and 7D. In the example configuration of FIG. 7C, each extension region 70z of a base 70 is cut in an arc shape. With this configuration, both ends in the longitudinal direction of the base 70 are curved such that the length in the longitudinal direction gradually becomes longer from the side of the side wall section 55 toward the side of the fixation unit 52. In the example configuration of FIG. 7D, a base 80 has an approximate rectangular shape in the planar view. On both ends in the longitudinal direction of the base 80, the fixation unit 52 is provided approximately perpendicular to the base 80, and a large part of the fixation unit 52 extends beyond both ends in the longitudinal direction of the base 80 toward the longitudinal direction. By employing the configurations shown in FIGS. 7C and 7D, for example, screwing of the fixation unit 52 can be further simplified. Additionally, present FIGS. 6, 7A, 7B, 7C, and 7D show that bases 51, 70, and 80 may include first edges 51a, 70a, and 80a and second edges 51b, 70b, and 80b in a width direction of the base. Regarding FIG. 7D, it will be understood that in at least an embodiment, a bottom edge of fixation unit 52 is considered to be an extension of first edge 80a. As further seen in each of FIGS. 6, 7A, 7B, 7C, and 7D, first edges 51a, 70a, and 80a have a length in the longitudinal direction of the base that is longer than a length of second edges 51b, 70b, and 80b.

Figure 8:
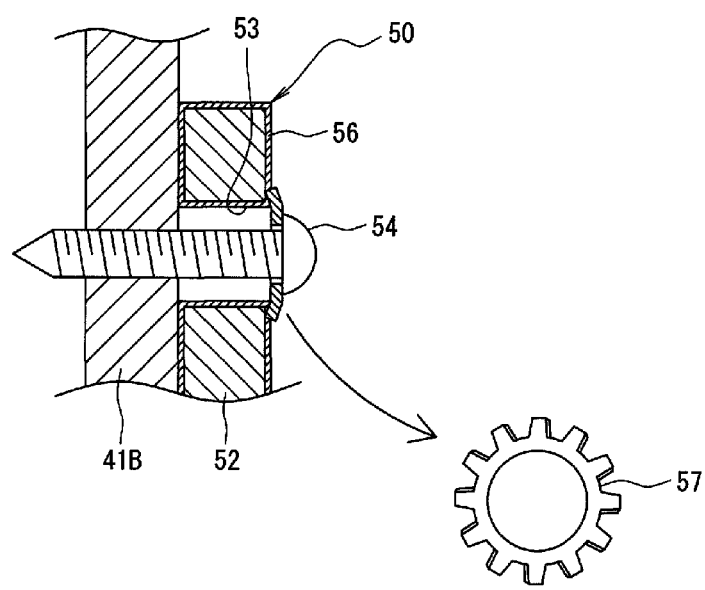
FIG. 8 is a cross sectional diagram showing a fixation structure of a terminal box cover according to another preferred embodiment of the present invention.

FIG. 8 is a cross sectional diagram showing a fixation structure of the first cover 50. As described above, the fixation unit 52 of the first cover 50 is screwed to the body 41B of the frame 40B using the screw 54 inserted into the screw hole 53. In this process, a washer may be provided on the screw 54. When the first cover 50 is made of a conductive material, an insulating layer 56 is preferably formed on the surface of the first cover 50. More specifically, when the first cover 50 is made of aluminum, an anodize process or the like may be applied. Further, when the insulating layer 56 is formed on the surface of the first cover 50, the fixation unit 52 is also preferably grounded through the body 41B.

In order to secure electrical conduction between a part of the fixation unit 52 and the body 41B, preferably, a toothed washer 57 is used as the above-described washer. With such a configuration, the tooth of the toothed washer 57 penetrates through the insulating layer 56 and contacts the metal of the fixation unit 52, and the electrical conduction between apart of the fixation unit 52 and the body 41B is secured through the washer and the screw 54. It is sufficient that the toothed washer 57 is provided on one of the two fixation units 52. In addition, the toothed washer may have any form such as an internal tooth type, an external tooth type, or the like, so long as the washer 57 has a tooth penetrating through the insulating layer 56, but is preferably of an external tooth type. In the example configuration of FIG. 8, the screw 54 and the toothed washer 57 are separate members, but alternatively, these elements may be integrated from the viewpoint of improvement of construction characteristic or the like.

The invention claimed is:

1. A solar cell module comprising:
   a solar cell panel;
   a terminal box having a substantially rectangular parallelepiped shape comprising a first surface, a second surface opposing the first surface, and a side surface, the first surface being attached to a surface on one side of the solar cell panel;
   a frame that is attached to an end edge of the solar cell panel;
   a metal cover comprising:
      a base that covers the second surface of the terminal box; and
      a fixation unit that is fixed to the frame; and
   a diode and a terminal base provided in the terminal box;
   wherein the base has a first edge in a width direction of the base and a second edge in the width direction of the base opposite to the first edge;
   a length of the first edge of the base in a longitudinal direction approximately perpendicular to the width direction is longer than a length of the second edge of the base in the longitudinal direction;
   wherein the fixation unit is provided at the first edge of the base, and the fixation unit extends from the base in a direction approximately perpendicular to the width direction of the base and the longitudinal direction of the base,
   a back surface of the solar cell panel is positioned on the first surface of the terminal box and an upper surface of a body of the frame; and
   the terminal box is positioned such that the side surface of the terminal box is provided along and facing a side surface of the body of the frame;
   when viewed along a direction parallel to the side surface of the terminal box, the fixation unit is positioned between the side surface of the terminal box and the side surface of the body of the frame;
   the upper surface of the body of the frame faces the back surface of the solar cell panel, which is a surface on a side opposite to the light receiving surface;
   the terminal box is attached on the back surface of the solar cell panel by an adhesive;
   wherein the frame is provided on an opposite surface to a surface on which the terminal box is provided; and
   the frame comprises;
      a flange portion extending from the end edge of the solar cell panel towards a center of the solar cell panel such that the flange portion entirely covers the terminal box when viewed from the opposite surface; and
      a concave portion to which the solar cell panel is fitted.

2. The solar cell module according to claim 1, wherein the terminal box and the metal cover are attached along a longitudinal direction of the frame,
   the solar cell module further comprises a side wall section that is provided at the second edge of the base and that covers a side surface of the terminal box.

3. The solar cell module according to claim 1, wherein the terminal box and the metal cover are attached along a longitudinal direction of the frame,
   the fixation unit comprises a first fixation unit and a second fixation unit, the first fixation unit being provided at a first end of the base in the longitudinal direction of the base, and the second fixation unit being provided at a second end of the base in the longitudinal direction of the base.

4. The solar cell module according to claim 1, wherein the fixation unit is screwed to the frame via a toothed washer.

5. The solar cell module according to claim 1, wherein the body of the frame comprises a cavity; and
   a corner piece is squeezed onto the cavity of the body of the frame.

* * * * *